United States Patent [19]

Jinbo

[11] Patent Number: 4,982,113
[45] Date of Patent: Jan. 1, 1991

[54] SIGNAL DISTRIBUTING UNIT FOR VARIOUS INPUT SIGNALS DIFFERENT IN VOLTAGE LEVEL

[75] Inventor: Toshikatsu Jinbo, Tokyo, Japan

[73] Assignee: NEC Corporation, Tokyo, Japan

[21] Appl. No.: 451,687

[22] Filed: Dec. 18, 1989

[30] Foreign Application Priority Data

Dec. 16, 1988 [JP] Japan ................... 63-317828

[51] Int. Cl.⁵ ........................................... H03K 17/10
[52] U.S. Cl. ................... 307/465; 307/443; 307/469; 307/296.2; 365/189.03
[58] Field of Search ............... 307/443, 448, 451, 465, 307/468–469, 475, 584, 585, 264, 296.2; 365/189.03, 189.09, 226

[56] References Cited

U.S. PATENT DOCUMENTS

| | | | |
|---|---|---|---|
| 4,350,906 | 9/1982 | Gillberg | 307/469 |
| 4,565,932 | 1/1986 | Kuo et al. | 307/475 X |
| 4,616,143 | 10/1986 | Miyamoto | 307/475 X |
| 4,682,052 | 7/1987 | Kyomasu | 307/451 X |
| 4,697,101 | 9/1987 | Iwahashi et al. | 307/443 X |
| 4,697,106 | 9/1987 | Watanabe | 365/226 X |
| 4,837,460 | 6/1989 | Uchita | 307/296.2 X |
| 4,893,275 | 1/1990 | Tanaka et al. | 365/189.09 |
| 4,902,917 | 2/1990 | Simpson | 307/465 |
| 4,910,710 | 3/1990 | Kobatake | 365/189.03 X |

FOREIGN PATENT DOCUMENTS

0266799 11/1987 Japan ................... 365/189.03

*Primary Examiner*—David Hudspeth
*Attorney, Agent, or Firm*—Sughrue, Mion, Zinn, Macpeak & Seas

[57] ABSTRACT

For presenting a multipurpose signal pin provided in a semiconductor memory device from undesirable internal leakage current, a signal distributing unit has an inverter circuit responsive to a first external signal of either first and second voltage level for providing the second and first voltage level to a first internal control signal line and a gating circuit operative to block the first external signal but to transfer a second external signal of an extremely high voltage level to a second internal control signal line, and the gating circuit comprises a limiter transistor operative to keep off in the presence of the second external signal but to provide the second voltage level in the presence of the first external signal and a series combination of first and second gating transistors coupled to the multipurpose signal pin and associated with a voltage control circuit for producing gate control signals fed to the first and second gating transistors as well as a back gate biasing signal fed to the second gating transistor, wherein the first and second gating transistors are opposite in channel conductivity type so as to block the second voltage level on the second internal signal line to the multipurpose signal pin.

9 Claims, 6 Drawing Sheets

| SIGNAL<br>OPERATION | $\overline{OE}/V_{PP}$ | $\overline{PGM}$ | $S_1$ | $V_P$ | $O_e$ |
|---|---|---|---|---|---|
| READ MODE | $V_{IL}$ | Vcc | GND | Vcc | Vcc |
| OUTPUT DISABLE MODE | $V_{IH}$ | Vcc | GND | Vcc | GND |
| PROGRAM MODE | 12.5v | GND | EXTREMELY HIGH LEVEL | 12.5v | GND |

| SIGNALS / MODE | OE/Vpp | PGM | S11 | S12 | Vpm1 | Vp | Oe |
|---|---|---|---|---|---|---|---|
| READ MODE | VIL | Vcc | GND | Vcc | Vcc | Vcc | Vcc |
| OUTPUT DISABLE MODE | VIH | Vcc | GND | Vcc | Vcc | Vcc | GND |
| PROGRAM MODE | 12.5v | GND | EXTREMELY HIGH LEVEL | GND | EXTREMELY HIGH LEVEL | 12.5v | GND |

| MODE \ SIGNALS | OE/Vpp | PGM1 | PGM2 | S21 | S22 | Vpm2 | Vp | Oe |
|---|---|---|---|---|---|---|---|---|
| READ MODE | VIL | Vcc | GND | GND | Vcc | Vcc | Vcc | Vcc |
| OUTPUT DISABLE MODE | VIH | Vcc | GND | GND | Vcc | Vcc | Vcc | GND |
| PROGRAM MODE | 12.5v | GND | Vcc | EXTREMELY HIGH LEVEL | GND | EXTREMELY HIGH LEVEL | 12.5v | GND |

FIG. 7

SIGNAL DISTRIBUTING UNIT FOR VARIOUS INPUT SIGNALS DIFFERENT IN VOLTAGE LEVEL

FIELD OF THE INVENTION

This invention relates to a semiconductor device and, more particularly, to a signal distributing unit for distributing various input signals different in voltage level from one another to respective destinations.

DESCRIPTION OF THE RELATED ART

Integrated circuits fabricated on semiconductor chips are associated with a plurality of signal pins for communication with external devices outside thereof, however, the dimension of the package set limitations on the number of the signal pins, and, for this reason, a plurality of input signals are assigned one of the signal pins so as to cope with increasing functions achieved by the semiconductor device.

Figure 1:
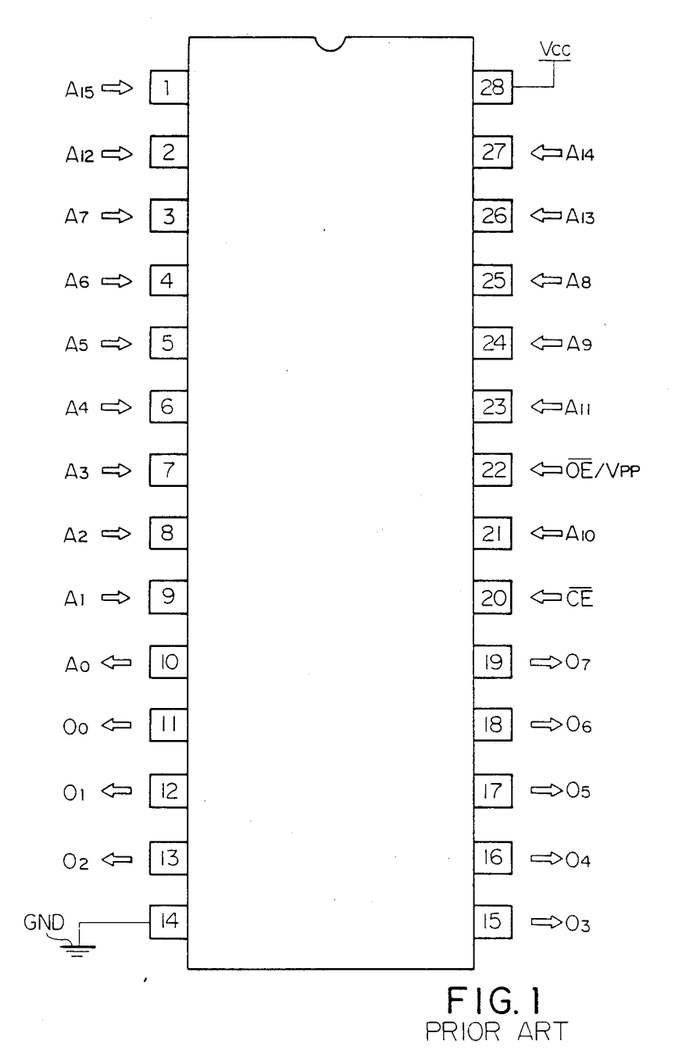
FIG. 1 is a plan view showing the signal pin layout of a prior art programmable read only memory device erasable with ultra-violet radiation.

A typical example of the semiconductor device provided with the multi-purpose signal pin is illustrated in FIG. 1 of the drawings, and the semiconductor device is of an eight-bit programmable read only memory device erasable with ultra-violet radiation. The programmable read only memory device provides a storage of 512 kilo-bits. The first to tenth, twenty first and twenty third to twenty seventh signal pins are assigned to an address signal consisting of address bits A15, A12, A7, A6, A5, A4, A3, A2, A1, A0, A10, A11, A9, A8, A13 and A14, and the eight-bit output signal is fed from the eleventh to thirteenth and fifteenth to nineteenth signal pins. The fourteenth signal pin is grounded, and the twenty eighth signal pin is coupled to a source of positive voltage Vcc. The twentieth signal pin is assigned to a chip enable signal $\overline{CE}$ of an active low voltage level, however, the twenty second signal pin is shared between an output enable $\overline{OE}$ signal of the active low voltage level and a write-in voltage signal. In this instance, the output enable signal $\overline{OE}$ ranges between the ground voltage level and the positive high voltage level Vcc, but the write-in signal Vpp is much higher than the positive high voltage level, i.e., 12.5 volts.

Figure 2:
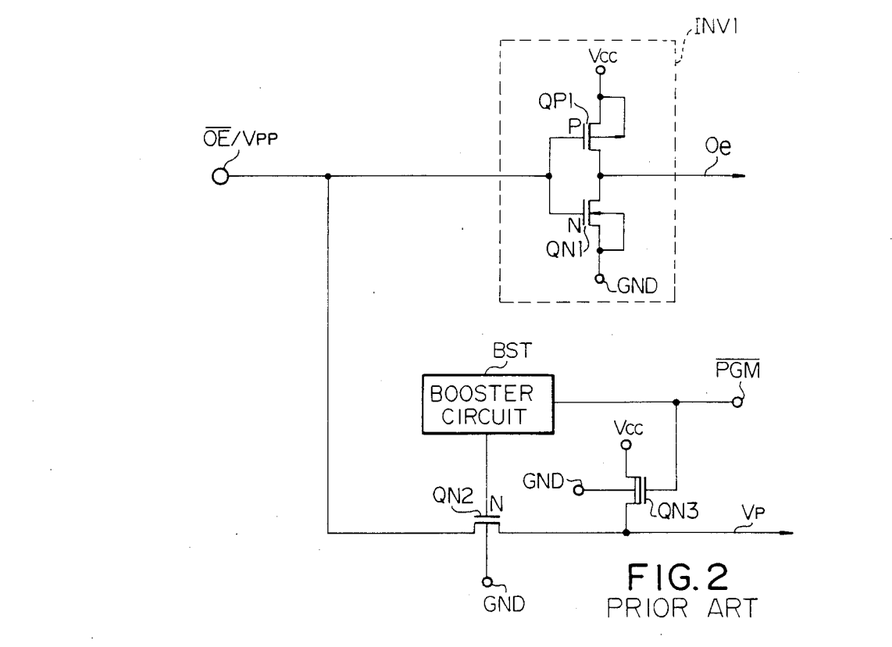
FIG. 2 is a circuit diagram showing the arrangement of a signal distributing unit incorporated in the prior art programmable read only memory device.

Thus, the twenty second signal pin is selectively supplied with the two input signals different in voltage level from one another, and is associated with a signal distributing unit shown in FIG. 2. The twenty second signal pin is coupled to an inverter circuit INV1 consisting of a series combination of a p-channel enhancement type field effect transistor QP1 and an n-channel enhancement type field effect transistor QN1 as well as the source node of a gate transistor QN2 formed by an n-channel enhancement type field effect transistor. The inverter circuit INV1 is coupled to an output enable signal line oe. A booster circuit BST is coupled to the gate electrode of the gate transistor QN2, and the drain node of the gate transistor QN2 is coupled to the write-in signal line Vp. The drain node of the gate transistor QN2 is further coupled to an n-channel depletion type field effect transistor QN3, and the booster circuit BST and the n-channel depletion type field effect transistor QN3 are responsive to a programming control signal $\overline{PGM}$ of the active low voltage level. When the programming control signal $\overline{PGM}$ goes down to the active low voltage level, the booster circuit BST is activated to produce a gate control signal S1 of an extremely high voltage level. However, if the programming control signal $\overline{PGM}$ is recovered to an inactive high voltage level, the booster circuit BST merely supplies the gate control signal of the low voltage level to the gate transistor QN2.

The signal distributing unit behaves as follows. The signal distributing unit enters into a read mode, an output disable mode or a program mode depending upon the voltage level at the twenty second signal pin.

If the output enable signal $\overline{OE}$ of an input low voltage level $V_{IL}$ is supplied to the twenty second signal pin, the p-channel enhancement type field effect transistor QP1 turns on, but the n-channel enhancement type field effect transistor QN1 remain in the off state, so that the output enable signal line oe goes up to the positive high voltage level Vcc, and an output circuit (not shown) enters into an output enable state. However, since the programming control signal $\overline{PGM}$ goes up to the positive high voltage level Vcc, the booster circuit BST produces the gate control signal S1 of the low voltage level GND. With the gate control signal S1 of the low voltage level GND, the gate transistor QN2 remains in the off state, and the voltage level at the twenty second signal pin is not transferred to the write-in signal line Vp. Since the n-channel depletion type field effect transistor QN3 supplies the high voltage level Vcc to the write-in signal line Vp. Then, the write-in signal line Vp is kept in the high voltage level Vcc.

If, on the other hand, the output enable signal $\overline{OE}$ of an input high voltage level $V_{IH}$ is supplied to the twenty second signal pin, the inverter circuit INV1 supplies the low voltage level to the output enable signal line oe with the n-channel enhancement type field effect transistor QN1 in the on state. The output circuit (not shown) enters into a disable state. The programming control signal $\overline{PGM}$ still remains in the high voltage level Vcc, and, accordingly, the output enable signal oe is not transferred from the twenty second signal pin to the write-in signal line Vp. However, the n-channel depletion type field effect transistor QN3 continues to supply the high voltage level Vcc to the write-in signal line Vp.

However, if the write-in voltage level Vpp is applied to the twenty second signal pin, the programming control signal $\overline{PGM}$ goes down to the low or ground voltage level, and the booster circuit BST allows the gate control signal S1 to go up to the extremely high voltage level. With the extremely high voltage level, the gate transistor QN2 turns on to transfer the write-in voltage level Vpp to the write-in voltage signal line Vp. However, the n-channel depletion type field effect transistor QN3 is turned off, because the drain node and the gate electrode thereof are supplied with the positive high voltage level Vcc and the ground voltage level, respectively.

Figure 3:
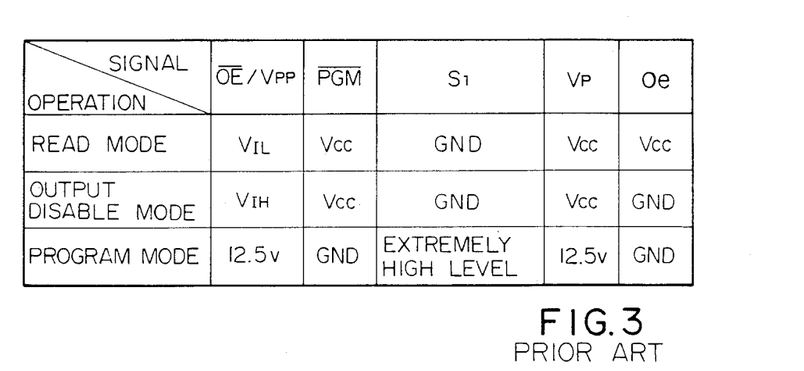
FIG. 3 shows the voltage levels of the essential signals produced in the prior art memory device.

In addition, the n-channel enhancement type field effect transistor QN1 turns on in the presence of the write-in voltage level Vpp, and the output enable signal line oe goes down to the ground voltage level. The circuit behavior of the distributing circuit is summarized in FIG. 3.

Thus, the gate transistor QN2 associated with the booster circuit BST is shifted between the on-state and the off-state depending upon the programming control signal $\overline{PGM}$, and, accordingly, the write-in voltage level Vpp is transferred to the write-in voltage signal line Vp, but the output enable signal $\overline{OE}$ is blocked by the gate transistor QN2 in the presence of the gate control signal S1 of the low voltage level.

However, a problem is encountered in the prior art signal distributing unit in that the booster circuit BST needs to cause the gate control signal S1 to go up to the extremely high voltage level higher than the write-in voltage level Vpp. This is because of the fact that the back-gate biasing phenomenon takes place in the gate transistor QN2, and the extremely high voltage level Vext is calculated as the following equation $$Vext = Vpp + Vth_{31}$$

where $Vth_{31}$ is the threshold voltage level taking the back-gate biasing phenomenon into account and Vpp is 12.5 volts in this instance. Thus, the extremely high voltage level Vext is necessary for transferring the write-in voltage level Vpp without any reduction in voltage level. However, if the booster circuit BST is designed to produce the extremely high voltage level Vext, the circuit is hardly implemented due to the complex circuit arrangement. The extremely high voltage level Vext is further causative of undesirable damage to the gate insulating film of the gate transistor.

Still another problem encountered in the prior art signal distributing unit is undesirable leakage current. Namely, when the twenty second signal pin goes down to the negative voltage level, the gate transistor QN2 is liable to turn on even if the gate electrode remains in the ground voltage level. If the gate transistor QN2 turns on, current flows through the n-channel type depletion type field effect transistor QN3 as well as the gate transistor, and, finally, reaches the twenty second signal pin.

Some of those problems would be solved by replacing the gate transistor QN2 with a depletion type field effect transistor, however, the gate control signal S1 should be lowered than the ground level for preventing the twenty second signal pin from the leakage current, so that another problem is encountered in the booster circuit.

SUMMARY OF THE INVENTION

It is therefore an important object of the present invention to provide a signal distributing unit which is not causative of the leakage current.

It is also an important object of the present invention to provide a signal distributing unit which does not need the extremely high voltage level Vext for transferring the write-in voltage level without any reduction in voltage level.

To accomplish these objects, the present invention proposes to change not only the gate control signals but also the back-gate biasing signals of two field effect transistors coupled between the multipurpose signal pin and the write-in signal line depending upon the mode of operation.

In accordance with the present invention, there is provided a signal distributing unit provided in association with a multipurpose signal pin supplied with first, second and third voltage levels different from one another, comprising: (a) a first inverter circuit coupled between the multipurpose signal pin and a first control signal line and operative to produce a first internal control signal of either first or second voltage level when the second or first voltage level is supplied to the multipurpose signal pin; (b) a gating circuit coupled between the multipurpose signal pin and a second control signal line and operative to block the first and second voltage level fed from the multipurpose signal pin and to transfer the third voltage level to the second control signal line for producing a second internal control signal, in which the gating circuit comprises a series combination of a first gating transistor of a first channel conductivity type and a second gating transistor of a second channel conductivity type opposite to the first channel conductivity type, a limiter transistor responsive to a programming control signal and operative to keep off in the presence of the third voltage level at the multipurpose signal pin and to supply the second voltage level to the second control signal line in so far as the first or second voltage level is supplied to the multipurpose signal pin, and a voltage control circuit responsive to the programming control signal and operative to produce a back gate biasing signal fed to the second gating transistor, a first gate control signal fed to the first gating transistor and a second gate control signal fed to the second gating transistor.

BRIEF DESCRIPTION OF THE DRAWINGS

The features and advantages of a according to the present invention will be more clearly understood from the following description taken in conjunction with the accompanying drawings in which.

DESCRIPTION OF THE PREFERRED EMBODIMENTS

First Embodiment

Figure 4:
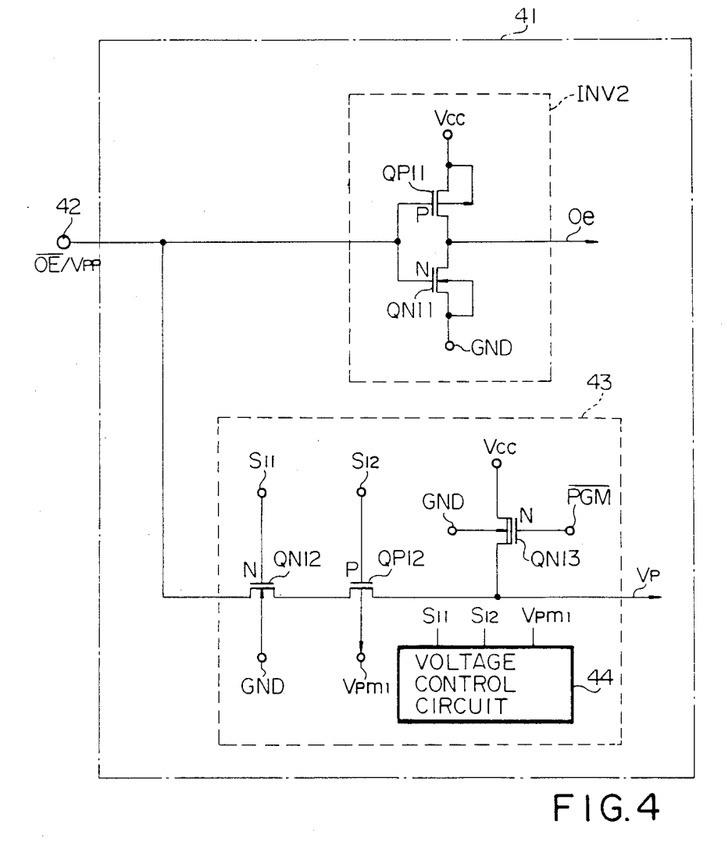
FIG. 4 is a circuit diagram showing the arrangement of a signal distributing unit embodying the present invention.

Turning to FIG. 4 of the drawings, a signal distributing unit incorporated in a semiconductor memory device is fabricated on a semiconductor substrate 41 together with various component circuits indispensable to the memorizing facility. The semiconductor memory device is of the type illustrated in FIG. 1, and, for this reason, is provided with a multipurpose signal pin 42 such as the twenty second signal pin. The multi-purpose signal pin 42 is supplied with not only an output enable signal ranging between the ground voltage level and a positive high voltage level Vcc but also a write-in voltage level Vpp of an extremely high voltage level Vext1. In this instance, the write-in voltage level Vpp is about 12.5 volts.

The multipurpose signal pin 42 is coupled in parallel to an inverter circuit INV2 and to a gate circuit 43. The inverter circuit INV2 is formed by a series combination of a p-channel enhancement type field effect transistor QP11 and an n-channel type enhancement type field effect transistor QN11, and the series combination is coupled between a source of the positive high voltage level Vcc and a source of the ground voltage level GND. The output node of the inverter circuit INV2 is coupled to an output enable signal line oe, and an output circuit (not shown) is activated or inactivated depending upon the voltage level of the output enable signal line oe.

The gate circuit 43 comprises a series combination of first and second gate transistors QN12 and QP12 coupled between the multipurpose signal pin 42 and a write-in signal line Vp, a limiter transistor QN13 formed by an n-channel depletion type transistor, and a voltage control circuit 44. The first gate transistor QN12 is of the n-channel enhancement type field effect transistor, and a back-gate biasing voltage level is fixed to the ground level, but the gate electrode is supplied from the voltage control circuit 44 with a first gate control signal S11. On the other hand, the second gate transistor QP12 is of the p-channel enhancement type field effect transistor, and a second gate control signal S12 is supplied from the voltage control circuit 44. A back-gate biasing voltage level Vpm1 is changed by the voltage control circuit 44. The limiter transistor QN13 is of the n-channel depletion type field effect transistor, and responsive to a program controlling signal $\overline{PGM}$. Namely, when the programming control signal $\overline{PGM}$ goes down to the ground voltage level, the limiter transistor QN13 turns off to cut off a conduction path between the source of the positive voltage level Vcc and the write-in signal line Vp, however, the limiter transistor QN13 is turned on in so far as the programming control signal $\overline{PGM}$ remains in the positive high voltage level Vcc for maintaining the write-in signal line Vp in the positive high voltage level Vcc.

Figure 5:
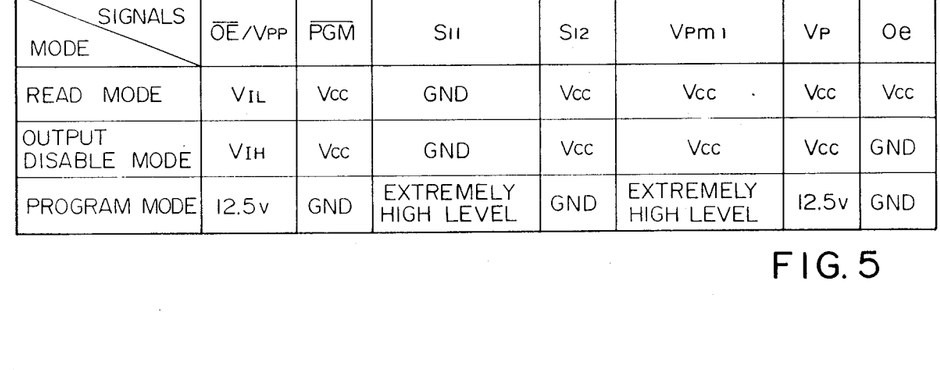
FIG. 5 shows the voltage levels of the essential signals produced in the signal distributing unit shown in FIG. 4.

Description is made for the behavior of the signal distributing unit, and a read mode, an output disable mode and a program mode are selectively established in the programmable read only memory device erasable with the ultra-violet radiation. Although the three modes of operation are summarized in FIG. 5, the respective behaviors are described hereinbelow.

When the output enable signal $\overline{OE}$ goes down to the low voltage level $V_{IL}$, the programmable read only memory device enters into the read mode of operation. Namely, the p-channel enhancement type field effect transistor QP11 turns on to supply the positive voltage level Vcc to the output enable signal line oe, then the data bits are fed from an output buffer circuit (not shown) to the outside of the programmable read only memory device. However, since the first gate control signal S11 remains in the ground voltage level, the first gate transistor QN12 is kept in the off state. The second gate transistor QP12 is also turned off, because the second gate control signal S12 and the back gate biasing signal Vpm1 are in the positive high voltage level Vcc. Then, the output enable signal of the low voltage level is never transferred to the write-in signal line Vp. In the read mode of operation, the programming control signal $\overline{PGM}$ is in the positive high voltage level Vcc, so that the write-in signal line Vp is charged up to the positive voltage level.

Subsequently, if the output enable signal $\overline{OE}$ goes up to the high voltage level $V_{IH}$, the output disable mode of operation is established in the programmable read only memory device. Namely, the inverter circuit INV2 allows the output enable signal line oe to go down to the ground voltage level, and the output buffer circuit (not shown) remain inactive. The first gate control signal S11 continues to remain in the ground voltage level Vcc, and the second gate control signal S12 and the back gate biasing voltage signal Vpm1 are in the positive high voltage level, so that both of the first and second gate transistors QN12 and QP12 are turned off. Thus, the output enable signal $\overline{OE}$ can not reach the write-in signal line Vp. Since the programming control signal $\overline{PGM}$ remains in the positive high voltage level Vcc, the write-in signal line Vp remains in the positive high voltage level Vcc.

If the output enable signal $\overline{OE}$ is lowered below the ground level, the first gate transistor QN12 is liable to turn on, however, the second gate transistor QP12 remains off, so that current is surely blocked by the second gate transistor QP12, thereby hardly reaching the multipurpose signal pin 42.

When the multipurpose signal pin 42 is supplied with the extremely high voltage level Vext1 of about 12.5 volts, the programmable read only memory device enters into the program mode of operation. Since the n-channel enhancement type field effect transistor QN11 turns on in the presence of the extremely high voltage level Vext1, the output enable signal line oe goes down to the ground level.

In the program mode of operation, the first gate control signal S11 and the back gate biasing signal Vpm1 goes up to an extremely high voltage level Vext2, and the second gate biasing signal S12 remains in the ground voltage level. Then, both of the first and second gate transistors QN12 and QP12 simultaneously turn on to provide a conduction path between the multipurpose signal pin 42 and the write-in signal line Vp, and the n-channel depletion type field effect transistor QN13 turns off in the presence of the programming control signal $\overline{PGM}$ of the ground voltage level. Since the extremely high voltage level Vext2 is higher than the extremely high voltage level Vext1 by the threshold voltage level Vthn12 taking the back gate biasing phenomenon into account, the extremely high voltage level Vext1 passes the first and second gate transistors QN12 and QP12 without any reduction in voltage level, and the write-in signal line Vp propagates the extremely high voltage level Vext1.

Second Embodiment

Figure 6:
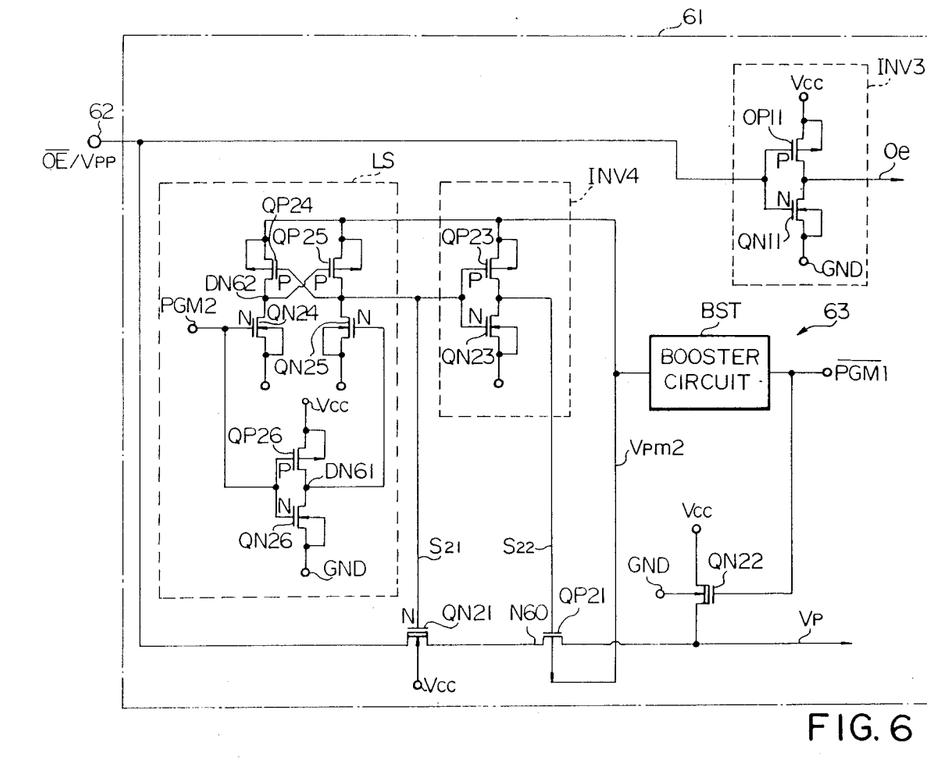
FIG. 6 is a circuit diagram showing the arrangement of another signal distributing unit embodying the present invention.

Turning to FIG. 6 of the drawings, the circuit arrangement of another signal distributing unit according to the present invention is illustrated. The signal distributing unit shown in FIG. 6 is also implemented on a semiconductor substrate 61 together with other component circuits, however, no description is incorporated, because the other component circuits are well known in the art.

The signal distributing circuit shown in FIG. 6 is also associated with a multipurpose signal pin 62 where an output enable signal $\overline{OE}$ and a write-in signal Vpp of an extremely high voltage level Vext1 are selectively supplied. The signal distributing unit largely comprises an inverter circuit INV3 and a gating circuit 63. The inverter circuit INV3 is similar in circuit arrangement to the inverter circuit INV2, and, for this reason, the component field effect transistors are designated by the same reference symbols as those of the inverter circuit INV2.

The gating circuit 63 comprises first and second gate transistors QN21 and QP21 coupled in series between the multipurpose signal pin 62 and a write-in signal line Vp, and the second gate transistor QP21 is of the p- channel enhancement type field effect transistor as similar to the first embodiment. However, the first gate transistor QN21 is formed by an n-channel depletion type field effect transistor.

The gating circuit 63 further comprises a booster circuit BST and a limiter transistor QN22 implemented by an n-channel depletion type field effect transistor. Both of the booster circuit BST and the limiter transistor QN22 are responsive to a first programming control signal $\overline{PGM1}$ of an active low voltage level. Namely, the booster circuit BST produces a back gate biasing signal Vpm2 of the positive high voltage level Vcc as long as the first programming control signal $\overline{PGM1}$ remains in the positive high voltage level, however, if the first programming control signal $\overline{PGM1}$ goes down to the ground voltage level, the back gate biasing signal Vpm2 goes up to an extremely high voltage level Vext3. On the other hand, the n-channel depletion type field effect transistor QN22 turns on or off depending upon the first programming control signal $\overline{PGM1}$.

The back gate biasing signal Vpm2 is supplied to an inverter circuit INV4 and a level shift circuit LS. Namely, the inverter circuit INV4 is coupled between the back gate biasing signal line and the ground line GND, and the inverter circuit INV4 is implemented by a series combination of a p-channel enhancement type filed effect transistor QP23 and an n-channel enhancement type field effect transistor QN23. The output node OUT4 of the inverter circuit INV4 is coupled to the second gating transistor QP21, and supplies a second gate control signal S22 to the second gating transistor QP21.

On the other hand, the level shift circuit LS comprises first and second series combinations of p-channel enhancement type field effect transistors QP24 and QP25 and n-channel type enhancement type field effect transistors QN24 and QN25, and a third series combination of a p-channel enhancement type field effect transistor QP26 and an n-channel enhancement type field effect transistor QN26. The drain nodes of the p-channel enhancement type field effect transistors QP24 and QP25 are coupled to the gate electrodes of the opposite field effect transistors QP25 and QP24, respectively. A second programming control signal PGM2 of the active high voltage level is supplied in parallel to the gate electrode of the n-channel enhancement type field effect transistor QN24 and the gate electrodes of the the component transistors QP26 and QN26 of the third series combination, and the common drain node of the third series combination is coupled to the n-channel enhancement type field effect transistor QN25. The first and second programming control signals $\overline{PGM1}$ and PGM2 are thus opposite in active level, and are complementarily shifted between the high and low voltage levels. The common drain node of the second series combination is coupled to the gate electrodes of the inverter circuit INV4 as well as the gate electrode of the first gating transistor QN21, and, accordingly, the first gating transistor QN21 is controlled by a first gate control signal S21.

Figure 7:
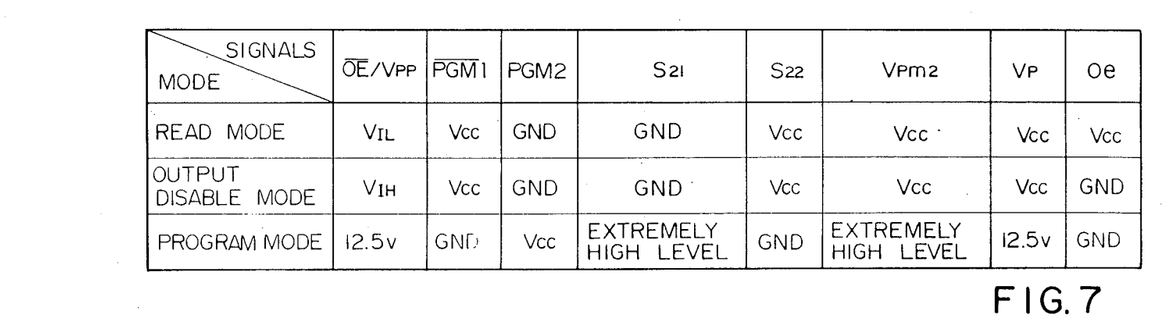
FIG. 7 shows the voltage levels of the essential signals produced in the signal distributing unit shown in FIG. 6.

Circuit behaviors of the second embodiment is hereinbelow described, and is summarized in FIG. 7. The signal distributing unit also has a read mode, an output disable mode and a program mode of operation as similar to the first embodiment.

First, when the signal distributing unit enters into the read mode of operation, an low voltage level $V_{IL}$ is supplied to the multipurpose signal pin 62, and, accordingly, the inverter circuit INV3 produces the high voltage level Vcc which is supplied to the output enable signal line oe. While the read mode of operation is established, the first programming control signal $\overline{PGM1}$ remains in the high voltage level Vcc, and, accordingly, the second programming control signal PGM2 goes down to the ground voltage level. With the first programming control signal $\overline{PGM1}$ of the high voltage level, the booster circuit BST shifts the back gate biasing signal Vpm2 to the high voltage level Vcc, and the limiter transistor QN22 turns on to provide the conduction path between the source of the positive voltage level Vcc and the write-in signal line Vp.

Since the second programming control signal PGM2 is in the ground voltage level GND, the p-channel enhancement type field effect transistor QP26 turns on, but the n-channel enhancement type field effect transistors QN24 and QN26 remain off, so that the n-channel enhancement type field effect transistor QN25 turns on to produce the first gate control signal S21 of the ground voltage level which in turn allows the inverted circuit INV4 to produce the second gate control signal S22 of the positive high voltage level Vcc. Although the signal S21 is in the ground voltage level and the ground voltage level is supplied to the gate of the first gating transistor QN21, the first gating transistor QN21 is turned on because of the depletion type. However, the second transistor QP21 remains in the off state, because the signal S22 is in the positive high voltage level Vcc. Thus, the write-in signal line Vp is electrically isolated from the multipurpose signal pin 62, and the limiter transistor QN22 continues to supply the positive high voltage level Vcc to the write-in signal line Vp.

Subsequently, if the signal distributing unit enters into the output disable mode of operation with the high voltage level $V_{IH}$ at the multipurpose signal pin 62, the inverter circuit INV3 supplies the ground voltage level GND to the output enable signal line oe, and, for this reason, no data bit is fed from the output circuit (not shown) to the outside thereof. While the output disable mode of operation is established, the first programming control signal $\overline{PGM1}$ continues to remain in the high voltage level Vcc, and, accordingly, the second programming control signal PGM2 keeps itself in the ground voltage level. With the first programming control signal $\overline{PGM1}$ of the high voltage level, the booster circuit BST shifts the back gate biasing signal Vpm2 to the high voltage level Vcc, and the limiter transistor QN22 turns on to provide the conduction path between the source of the positive voltage level Vcc and the write-in signal line Vp.

Since the second programming control signal PGM2 is in the ground voltage level GND, the p-channel enhancement type field effect transistor QP26 turns on, but the n-channel enhancement type field effect transistors QN24 and QN26 remain off, so that the n-channel enhancement type field effect transistor QN25 turns on to produce the first gate control signal S21 of the ground voltage level which in turn allows the inverter circuit INV4 to produce the second gate control signal S22 of the positive high voltage level. Although the signal S21 is in the ground voltage level and the ground voltage level is supplied to the gate of the first gating transistor QN21, the first gating transistor QN21 is turned on because of the depletion type. However, the second transistor QP21 remains in the off state, because the signal S22 is in the positive high voltage level Vcc.

The second gate control signal S22 causes the second gating transistor to turn off. Thus, the write-in signal line Vp is electrically isolated from the multipurpose signal pin 62, and the limiter transistor QN22 continues to supply the positive high voltage level Vcc to the write-in signal line Vp. In this circumstances, even if the voltage level at the multipurpose signal pin 62 exceeds the positive high voltage level Vcc, a node N60 between the first and second gating transistors QN21 and QP21 hardly goes up over the positive voltage level Vcc in so far as the threshold voltage level of the first gating transistor is adjusted to a certain value not less than -Vcc level. This results in that no current passes through the second gating transistor QP21.

Finally, if the extremely high voltage level Vext1 of 12.5 volt is applied to the multipurpose signal pin 62, the signal distributing unit enters into the program mode of operation. The inverter circuit INV3 maintains the output enable signal line oe in the ground voltage level. In the program mode of operation, the first programming control signal $\overline{PGM1}$ goes down to the ground voltage level GND, and, accordingly, the second programming control signal PGM2 goes up to the positive high voltage level Vcc. When the first programming control signal $\overline{PGM1}$ is in the ground voltage level GND, the booster circuit BST shifts the back gate biasing signal Vpm2 into the extremely high voltage level Vext3 which is supplied to not only the second gating transistor QP21 but also the inverter and level shift circuits INV4 and LS. Since the first programming signal $\overline{PGM1}$ of the ground voltage level $\overline{PGM1}$ is further fed to the limiter transistor QN22, no conduction path is provided from the source of the positive voltage level Vcc and the write-in signal line Vp.

With the second programming control signal PGM2 of the positive high voltage level Vcc, both of the n-channel enhancement type field effect transistors QN24 and QN26 turn on so that the ground voltage level is propagated to common drain nodes DN61 and 62. The common drain node DN61 of the ground voltage level permits the n-channel enhancement type field effect transistor QN25 to turn off, however, the common drain node DN62 of the ground voltage level causes the p-channel enhancement type field effect transistor QP25 to turn on. Since the extremely high voltage level Vext3 passes through the p-channel enhancement type field effect transistor QP25, the first gate control signal S21 goes up to the extremely high voltage level Vext3. However, the inverter circuit INV4 produces the second gate control signal S22 of the ground voltage level in the presence of the extremely high voltage level Vext3.

The first and second gate control signals S21 and S22 allow the first and second gating transistors QN21 and QP21 to turn on, respectively, and, for this reason, the first and second gating transistors Qp21 and QN21 propagate the extremely high voltage level Vext1 to the write-in signal line Vp.

In order to allow the second gating transistor QP21 to pass the extremely high voltage level Vext1 of 12.5 volts without any reduction, the back gate biasing signal Vpm2 is equal to or greater than the extremely high voltage level Vext1 of 12.5 volts, so that the back gate biasing voltage level Vpm2 is represented as follows:

$$Vpm2 \geq 12.5 \text{ volts} \qquad \text{(Equation 1)}$$

Since the back gate biasing signal Vpm2 is used for producing the first gate control signal S21, the back gate biasing signal Vpm2 needs to satisfy Equation 2

$$Vpm2 \geq 12.5 \text{ volts} + Vth21 \qquad \text{(Equation 2)}$$

where Vth21 is the threshold voltage of the n-channel depletion type field effect transistor QN21 on the assumption that a fixed back gate biasing signal of 12.5 volts. Since the back gate biasing signal Vpm2 needs to satisfy both Equations 1 and 2, the back gate biasing signal Vpm2 is adjusted to about 12.5 volts in this instance.

As will be understood from the foregoing description, the series combination of the first and second gating transistors according to the present invention perfectly blocks the positive voltage level Vcc on the write-in signal line Vp even if the multipurpose signal pin fluctuates in voltage level beyond the regular range, and, for this reason, the multipurpose signal pin is surely prevented from undesirable leakage current. Moreover, when the first gating transistor is implemented by the depletion type field effect transistor, the first gate control signal is reduced in voltage level with respect to the prior art unit, and, for this reason, no damage takes place in the gate insulating film of the first gating transistor.

Although particular embodiments of the present invention have been shown and described, it will be obvious to those skilled in the art that various changes and modifications may be made without departing from the spirit and scope of the present invention.

What is claimed is:

1. A signal distributing unit provided in association with a multipurpose signal pin supplied with first, second and third voltage levels different from one another, comprising:
   (a) a first inverter circuit coupled between said multipurpose signal pin and a first control signal line and operative to produce a first internal control signal of either first or second voltage level when said second or first voltage level is supplied to the multipurpose signal pin;
   (b) a gating circuit coupled between said multipurpose signal pin and a second control signal line and operative to block said first and second voltage level fed from the multipurpose signal pin and to transfer said third voltage level to the second control signal line for producing a second internal control signal, in which said gating circuit comprises a series combination of a first gating transistor of a first channel conductivity type and a second gating transistor of a second channel conductivity type opposite to the first channel conductivity type, a limiter transistor responsive to a programming control signal and operative to keep off in the presence of said third voltage level at said multipurpose signal pin and to supply said second voltage level to said second control signal line in so far as said first or second voltage level is supplied to said multipurpose signal pin, and a voltage control circuit responsive to said programming control signal and operative to produce a back gate biasing signal fed to said second gating transistor, a first gate control signal fed to said first gating transistor and a second gate control signal fed to the second gating transistor.

2. A signal distributing unit as set forth in claim 1, in which said first and second gating transistors are implemented by an n-channel enhancement type field effect transistor and a p-channel enhancement type field effect transistor, respectively.

3. A signal distributing unit as set forth in claim 2, in which said limiter transistor is implemented by an n-channel depletion type field effect transistor coupled between a first source of a positive high voltage level and a second source of the ground voltage level.

4. A signal distributing unit as set forth in claim 3, in which said first, second and third voltage levels are the ground voltage level, a positive high voltage level and an extremely high positive voltage level, respectively.

5. A signal distributing unit as set forth in claim 1, in which said first and second gating transistors are implemented by an n-channel depletion type field effect transistor and a p-channel enhancement type field effect transistor, respectively, and in which said first gating transistor is supplied with a fixed back gate biasing voltage level.

6. A signal distributing unit as set forth in claim 5, in which said limiter transistor is implemented by an n-channel depletion type field effect transistor coupled between a first source of a positive high voltage level and a second source of the ground voltage level.

7. A signal distributing unit as set forth in claim 6, in which said first, second and third voltage levels are the ground voltage level, a positive high voltage level and an extremely high positive voltage level, respectively, and in whiCh said fixed back gate biasing voltage level is as large as the positive voltage level.

8. A signal distributing unit as set forth in claim 7, in which said programming control signal remains in said positive high voltage level in the presence of either first and second voltage level at said multipurpose signal pin but goes down to the ground voltage level in the presence of said third voltage level at the multipurpose signal pin so that said limiter transistor turns on in the presence of the programming control signal of the positive high voltage level, however, the programming control signal of the ground level keeps the limiter transistor off.

9. A signal distributing unit as set forth in claim 8, in which said voltage control circuit comprises a booster circuit responsive to said programming control signal and operative to produce said back gate biasing signal of the positive high voltage level in the presence of the programming control signal of the positive high voltage level and to shift the back gate biasing signal into another extremely high positive voltage level lower than said extremely high positive voltage level in the presence of the programming control signal of the ground voltage level, a level shift circuit responsive to the complementary signal of said programming control signal and operative to produce said first gate control signal of the ground voltage level in the presence of the complementary signal of the ground voltage level and to shift the first gate control signal into said another extremely high voltage level in the presence of the complementary signal of the positive high voltage level, and a second inverter circuit responsive to the first gate control signal and operative to produce said second gate control signal of the positive high voltage level in the presence of the first gate control signal of the ground voltage level and to shift the second gate control signal into the ground voltage level in the presence of the first gate control signal of said another extremely high positive voltage level.

* * * * *

UNITED STATES PATENT AND TRADEMARK OFFICE
CERTIFICATE OF CORRECTION

PATENT NO. : 4,982,113
DATED : January 1, 1991
INVENTOR(S) : Toshikatsu JINBO

It is certified that error appears in the above-identified patent and that said Letters Patent is hereby corrected as shown below:

Column 7, line 27, delete "filed", and insert --field--;

Column 11, line 31, delete "whiCh", and insert --which--.

Signed and Sealed this

Twenty-second Day of September, 1992

Attest:

DOUGLAS B. COMER

*Attesting Officer*     *Acting Commissioner of Patents and Trademarks*